United States Patent
Ory

(10) Patent No.: US 11,581,304 B2
(45) Date of Patent: Feb. 14, 2023

(54) PROTECTION DEVICE

(71) Applicant: STMicroelectronics (Tours) SAS, Tours (FR)

(72) Inventor: Olivier Ory, Tours (FR)

(73) Assignee: STMicroelectronics (Tours) SAS, Tours (FR)

( * ) Notice: Subject to any disclaimer, the term of this patent is extended or adjusted under 35 U.S.C. 154(b) by 87 days.

(21) Appl. No.: 16/987,066

(22) Filed: Aug. 6, 2020

(65) Prior Publication Data

US 2021/0043622 A1    Feb. 11, 2021

(30) Foreign Application Priority Data

Aug. 9, 2019   (FR) ...................... 1909122

(51) Int. Cl.
*H01L 27/02* (2006.01)
*H01L 29/06* (2006.01)

(52) U.S. Cl.
CPC ...... *H01L 27/0262* (2013.01); *H01L 27/0255* (2013.01); *H01L 29/0688* (2013.01)

(58) Field of Classification Search
CPC ............... H01L 29/735; H01L 27/0262; H01L 27/0255; H01L 27/0259; H01L 29/1008; H01L 27/067; H01L 27/0711–0783; H01L 29/0808; H01L 29/1004–1008; H01L 29/41708; H01L 29/66295; H01L 29/0821; H01L 27/0623

See application file for complete search history.

(56) References Cited

U.S. PATENT DOCUMENTS

| | | | |
|---|---|---|---|
| 6,501,632 B1 * | 12/2002 | Avery | H02H 9/046 361/111 |
| 2004/0016992 A1 | 1/2004 | Mallikarjunaswamy | |
| 2005/0224882 A1 | 10/2005 | Chatty et al. | |
| 2010/0133583 A1 | 6/2010 | Mawatari et al. | |
| 2013/0075866 A1 | 3/2013 | Otake et al. | |
| 2015/0236009 A1 * | 8/2015 | Gill | H01L 29/0821 438/335 |
| 2016/0093722 A1 * | 3/2016 | Tilke | H01L 21/76224 257/51 |
| 2017/0069620 A1 | 3/2017 | Tu et al. | |
| 2018/0301548 A1 * | 10/2018 | Clark | H01L 29/1608 |
| 2019/0319097 A1 * | 10/2019 | Kushner | H01L 29/1008 |

* cited by examiner

*Primary Examiner* — Wasiul Haider
(74) *Attorney, Agent, or Firm* — Seed Intellectual Property Law Group LLP

(57) ABSTRACT

The present disclosure provides an electronic device that includes a substrate. The substrate includes a well and a peripheral insulating wall laterally surrounding the well. At least one lateral bipolar transistor is formed in the well, and the at least one transistor has a base region extending under parallel collector and emitter regions. The peripheral insulating wall is widened in a first direction, parallel to the collector and emitter regions, so that the base region penetrates into the peripheral insulating wall.

16 Claims, 4 Drawing Sheets

PROTECTION DEVICE

BACKGROUND

Technical Field

The present disclosure generally concerns electronic devices and, more particularly, electronic devices of protection against electrostatic discharges.

Description of the Related Art

Electrostatic discharges (ESD) occurring in an unprotected integrated circuit may generate unwanted effects therein, most of the time resulting in a deterioration of elements forming part of the circuit. Such a deterioration often causes significant malfunctions, capable of making the circuit partially or even totally inoperative.

To avoid the damage potentially caused by an electrostatic discharge, current integrated circuits frequently comprise devices of protection against the effects of such electrostatic discharges. To be efficient, such protection devices should ideally have:

a trigger voltage which is both sufficiently low to properly protect the circuit in case of an electrostatic discharge, and also relatively high to avoid any untimely triggering during the normal operation of the circuit;

a hold voltage, after the starting of the protection, which is sufficiently low to enable to expose the circuit to the lowest possible voltage while ensuring a good dissipation of the electric current originating from the electrostatic discharge; and a dynamic resistance which is as low as possible so that a clamping voltage or limiting voltage, corresponding to the maximum voltage that can be reached in case of an electrostatic discharge, is as low as possible.

Current devices of protection against electrostatic discharges do not enable to reconcile all the above characteristics, which affects their performance.

BRIEF SUMMARY

There is a need to improve the performance of current devices of protection against electrostatic discharges.

An embodiment overcomes all or part of the disadvantages of known devices of protection against electrostatic discharges.

An embodiment provides an electronic device comprising a substrate comprising:

a well;

a peripheral insulating wall surrounding the well; and at least one lateral bipolar transistor formed in the well, having a base region extending under parallel collector and emitter regions, the wall being widened in a first direction, parallel to the collector and emitter regions, so that the base region penetrates into the wall.

According to one embodiment, the base region stops before the wall in a second direction perpendicular to the first direction.

According to one embodiment:

the substrate has a first conductivity type;

the wall has the first conductivity type;

the base region has the first conductivity type;

the well has a second conductivity type different from the first conductivity type; and the collector and emitter regions have the second conductivity type.

According to one embodiment, the base region penetrates into the wall over a distance in the range from approximately 20% to approximately 50% of the length of the base region in the first direction, preferably over a distance in the range from 20% to 50% of the length of the base region in the first direction.

According to one embodiment, the base region continues into the wall over a distance of approximately 30% of the length of the base region in the first direction, preferably over a distance equal to 30% of the length of the base region in the first direction.

According to one embodiment, the first conductivity type is p and the second conductivity type is n.

According to one embodiment, the first conductivity type is n and the second conductivity type is p.

According to one embodiment:

first contacting tracks are located vertically in line with the collector areas; and second contacting tracks are located vertically in line with the emitter areas.

One embodiment provides a device of protection against electrostatic discharges comprising at least one electronic device of such type.

According to one embodiment, the device has a holding voltage greater than 5 V and a clamping voltage of less than 7 V.

According to one embodiment, the device is suitable for protecting an application for which a limit voltage is between about 0 V and about 5 V, preferably between 0 V and 5 V.

BRIEF DESCRIPTION OF THE DRAWINGS

The foregoing and other features and advantages will be discussed in detail in the following non-limiting description of specific embodiments in connection with the accompanying drawings, in which.

DETAILED DESCRIPTION

Figure 1:
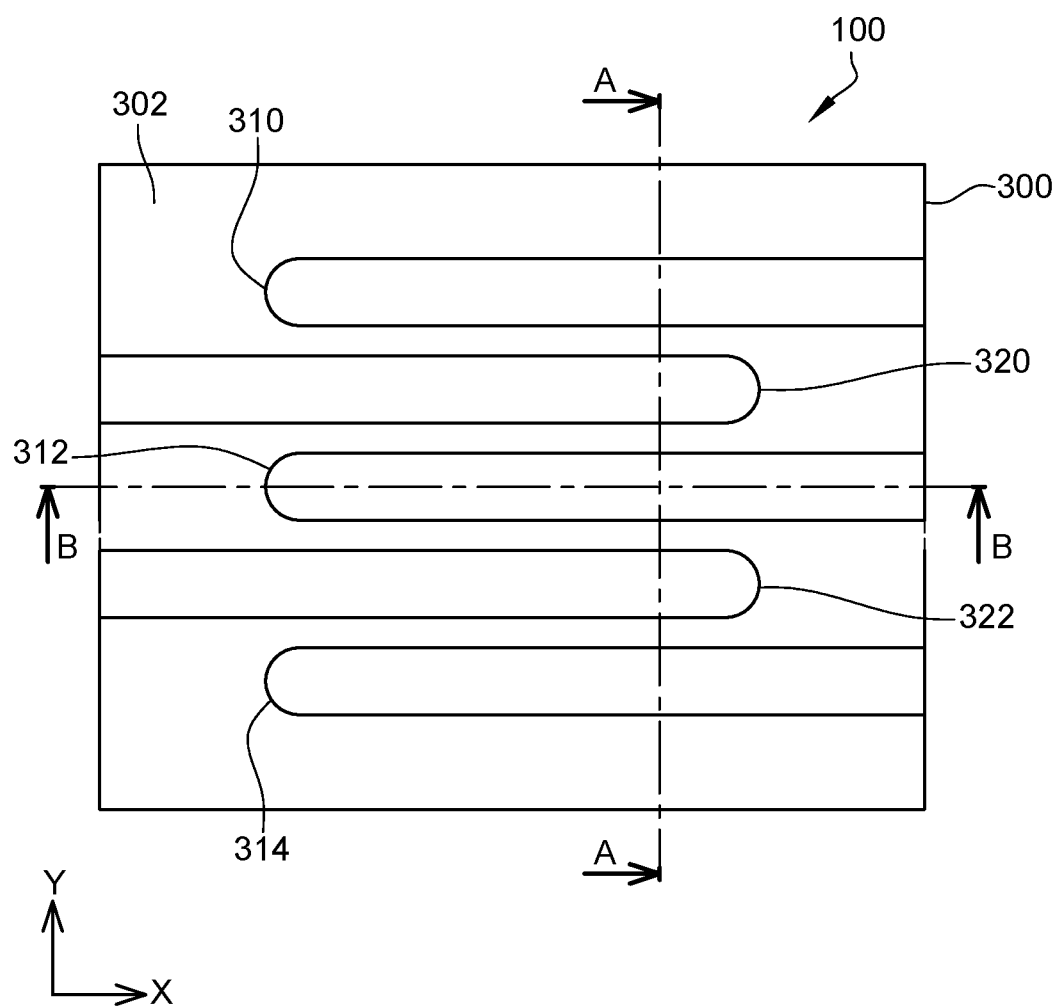
FIG. 1 schematically shows a top view of an embodiment of an electronic device.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the components or integrated circuits to be protected against electrostatic discharges will not be described, such components or integrated circuits being compatible with the components or circuits conventionally protected against electrostatic discharges.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front," "back," "top," "bottom," "left," "right," etc., or relative positions, such as terms "above," "under," "upper," "lower," etc., or to terms qualifying directions, such as terms "horizontal," "vertical," etc., unless otherwise specified, it is referred to the orientation of the drawings.

The terms "about," "substantially," and "approximately" are used herein to designate a tolerance of plus or minus 10%, preferably of plus or minus 5%, of the value in question.

FIG. 1 schematically shows a top view of an embodiment of an electronic device 100.

Device 100 integrates, in a substrate 300, one or a plurality of parallel lateral transistors. FIG. 1 is a top view illustrating the distribution of conductive contacting tracks of collector and emitter regions of the transistors.

According to this embodiment, device 100 is formed in all or part of substrate 300. Substrate 300 is, for example, a silicon wafer, only a rectangular portion thereof being shown in FIG. 1. Substrate 300 (or the portion of substrate 300) comprises, at its upper surface 302, an interdigitated structure.

In FIG. 1, the interdigitated structure is formed of:

first substantially parallel fingers 310, 312, and 314 extending along a first direction X at the upper surface 302 of substrate 300 from a first side of substrate 300 (the right-hand side, in FIG. 1); and second substantially parallel fingers 320 and 322 extending along the first direction X at the upper surface 302 of substrate 300 from a second side of substrate 300 (the left-hand side, in FIG. 1). This second side is, in the present example, the side opposite to the first side, so that first and second fingers 310, 312, 314, 320, and 322 are substantially parallel to one another.

First fingers 310, 312, and 314 form the contacting tracks of first regions (for example, collector regions of the transistors). The second fingers form the contacting tracks of second regions (for example, emitter regions of the transistors).

In other words, the interdigitated structure is here formed of two "combs," one formed of the first fingers 310, 312, and 314, and the other formed of the second fingers 320 and 322, which interpenetrate. The interdigitated structure thus comprises, along a second direction Y perpendicular to the first direction X, an alternation of first and of second fingers. In other words, two first neighboring fingers, respectively two second neighboring fingers, are separated by a second finger, respectively by a first finger.

First and second fingers 310, 312, 314, 320, and 322 are spaced apart from one another. In other words, fingers 310, 312, 314, 320, and 322 are not contiguous.

For simplification, in the example of FIG. 1, only five fingers (three first fingers 310, 312, 314 and two second fingers 320, 322) have been shown. Substrate 300 may however comprise a plurality of other first and second fingers interposed, still in the example of FIG. 1, between first finger 312 and second finger 322.

Substrate 300 may thus comprise any number of first fingers and any number of second fingers. The numbers of first and of second fingers may be different. Substrate 300 may, for example, comprise eight first fingers and seven second fingers.

Substrate 300 preferably comprises at least two first fingers and at least one second finger. FIG. 1 shows a substrate 300 comprising an odd number of first fingers and an even number of second fingers. However, in practice, substrate 300 may equally well comprise even or odd numbers of first and second fingers.

Figure 2:
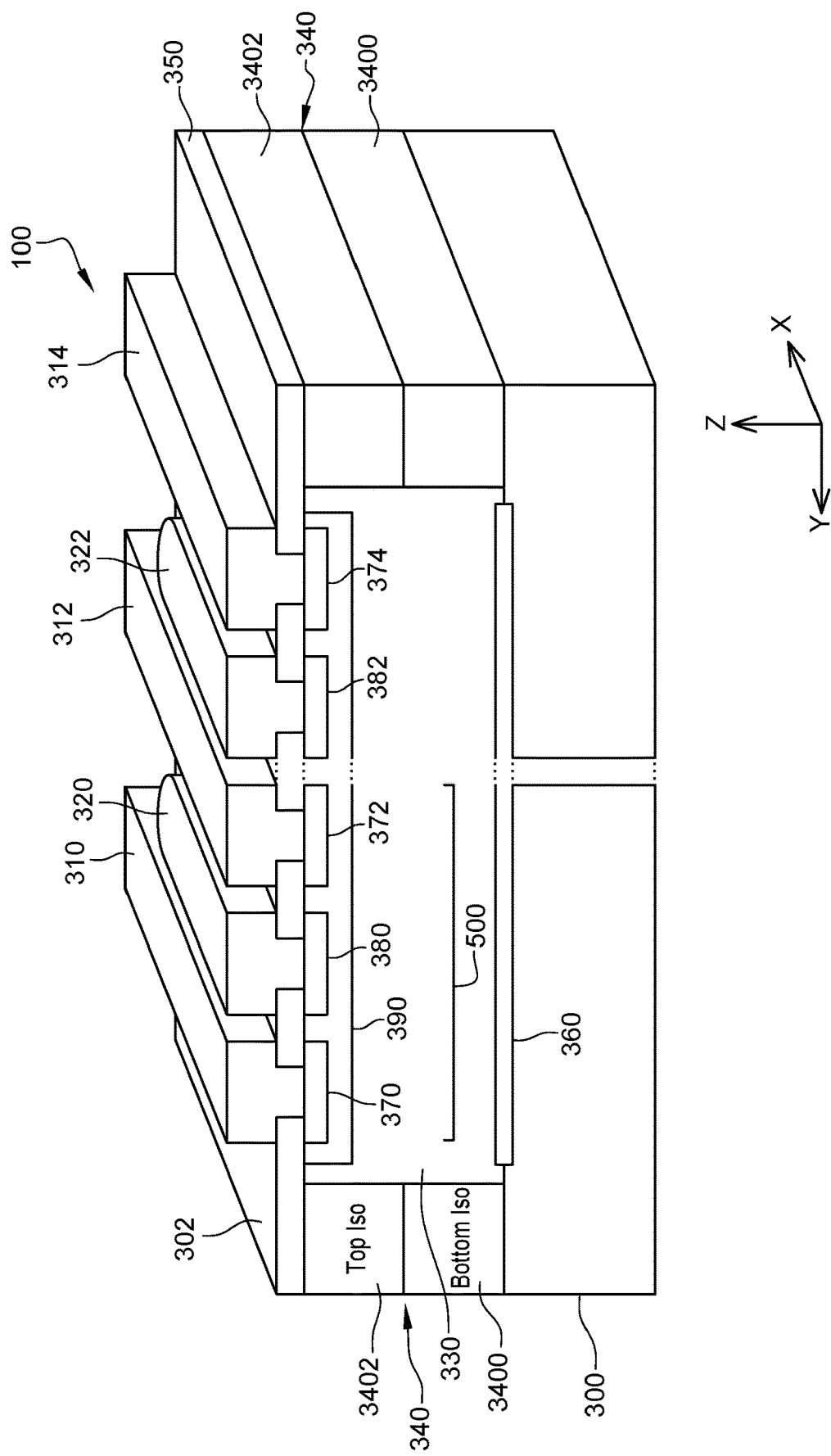
FIG. 2 schematically shows a perspective cross-section view along plane AA of FIG. 1.

FIG. 2 schematically shows a perspective cross-section view along plane AA of FIG. 1. Cross-section plane AA is perpendicular to direction X of first and second fingers 310, 312, 314, 320, and 322 (that is, parallel to direction Y).

In FIG. 2, substrate 300 comprises, under its upper surface 302, a well 330. Well 330 is laterally delimited by a peripheral insulating wall 340. In the cross-section view of FIG. 2, only the walls of insulating wall 340 which are parallel to axis X are visible. Insulating wall 340 comprises, in this example, a first area 3400 (Bottom Iso) and a second area 3402 (Top Iso) stacked in a third vertical direction (Z).

Substrate 300 is made of a material of a first conductivity type, for example, p-type doped single crystal silicon. Peripheral insulating wall 340 is of the same conductivity type as substrate 300, here of type p. Still in this example, first area 3400 is formed from a p-type buried layer. Second area 3402 is formed from another layer, also of type p.

Alternatively, well 330 has a thickness substantially equal to that of second area 3402 and wall 340 then comprises only this second area 3402.

Well 330 is formed, preferably, by epitaxy (by epitaxial growth) of a doped material of a second conductivity type, different from the first conductivity type. Well 330 is made, for example, of n-type silicon. Well 330 thus is of a conductivity type different from:

the conductivity type of substrate 300; and the conductivity type of wall 340.

Substrate 300 is passivated at its surface and thus comprises, in FIG. 2, a surface passivation layer 350. The upper surface 302 of substrate 300 thus corresponds, in the present example, to the upper surface of its passivation layer 350.

In FIG. 2, a third area 360 is formed at the interface between the lower surface of well 330 and substrate 300. Third area 360 extends along direction Y and stops before peripheral insulating wall 340. In this example, area 360 is formed from an n-type buried layer.

First regions 370, 372, and 374 and second regions 380 and 382 are formed under the passivation layer 350 of substrate 300. First and second regions 370, 372, 374, 380, and 382 are parallel, non-contiguous, and extend along first direction X. In the example of FIG. 2:

first regions 370, 372, and 374 are respectively located vertically in line with first fingers 310, 312, and 314; and second regions 380 and 382 are respectively located vertically in line with second fingers 320 and 322.

First fingers 310, 312, and 314 cross passivation layer 350 of substrate 300 to respectively contact first regions 370, 372, and 374. Similarly, second fingers 320 and 322 cross passivation layer 350 of substrate 300 to respectively contact second regions 380 and 382.

In FIG. 2, a third region 390 extends under first regions 370, 372, and 374, and under second regions 380 and 382, from the passivation layer 350 of substrate 300. Third region 390 stops, in second direction Y, before peripheral insulating wall 340.

First regions 370, 372, and 374 and second regions 380 and 382 are of the same conductivity type as well 330, in this example of type n. Third region 390 is of the same conductivity type as substrate 300, in the present example, of type p.

Third region 390 thus forms, with first regions 370, 372, and 374 and second regions 380 and 382, p-n junctions. In FIG. 2, first regions 370 and 372, second region 380, and third region 390 jointly form a lateral transistor 500, here of type NPN, also called NPN lateral transistor 500. In the present example:

first regions 370 and 372 form collector regions of transistor 500;

second region 380 forms an emitter region of transistor 500;

third region 390 forms a base region of transistor 500; and first region 374 and second region 382 respectively form a collector region and an emitter region of another NPN lateral transistor similar to transistor 500 and partially shown in FIG. 2.

First fingers 310 and 312, respectively connected to collector regions 370 and 372, thus form collector contacts of lateral NPN transistor 500. Second finger 320, connected to emitter region 380, forms an emitter contact of lateral NPN transistor 500. Base region 390 being connected to no contacting track, it is said to be the "floating base" of transistor 500.

Figure 3:
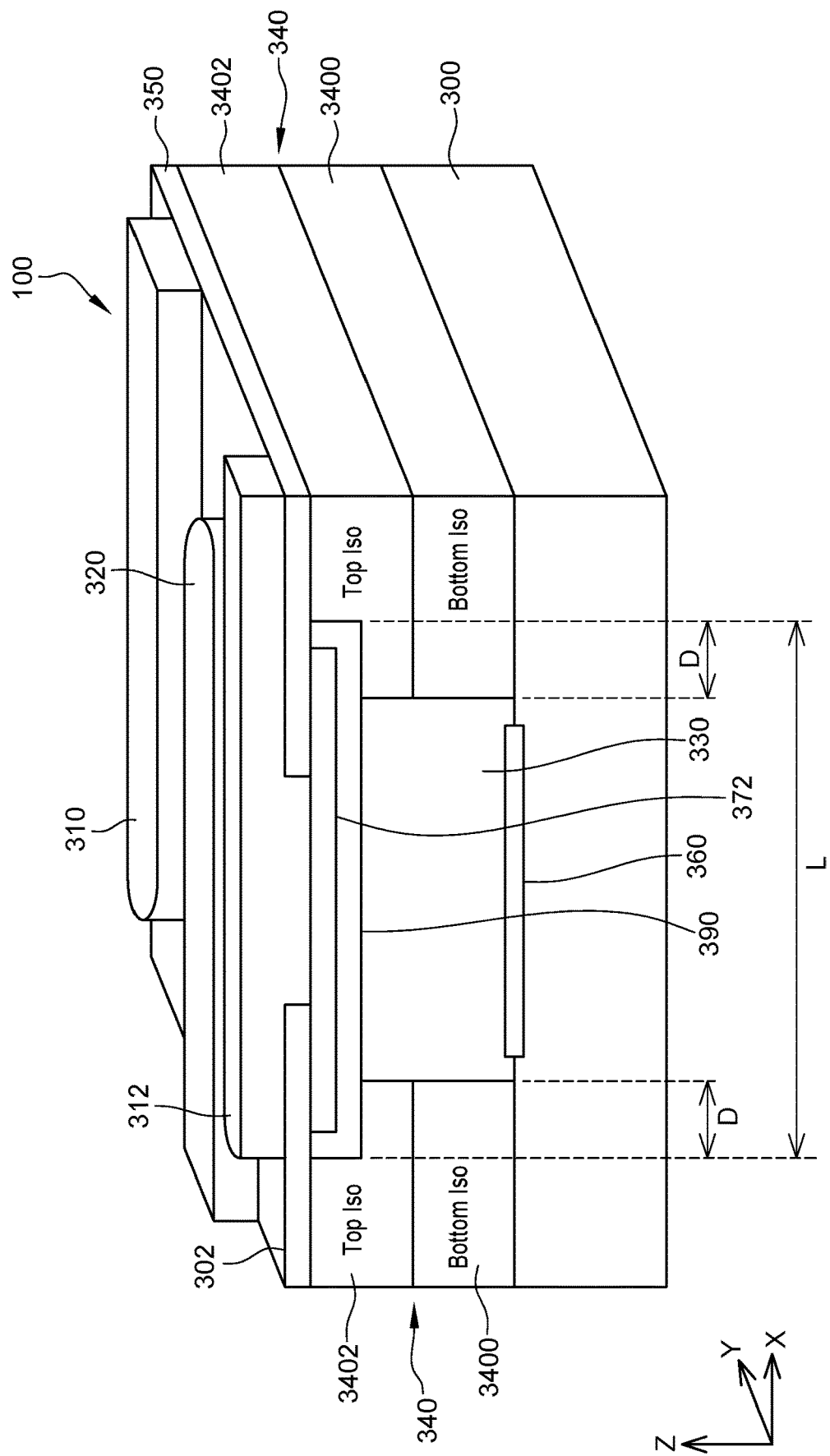
FIG. 3 schematically shows a perspective cross-section view along plane BB of FIG. 1.

FIG. 3 schematically shows a perspective and cross-section view along plane BB of FIG. 1. Cross-section plane BB is parallel to direction X of first and second fingers 310, 312, 314, 320, and 322 (that is, perpendicular to direction Y). In FIG. 3, only first finger 310, second finger 320, and a portion of first finger 312 are shown, plane BB (FIG. 1) approximately crossing substrate 300 in the middle of first finger 312.

In FIG. 3, well 300 is still laterally delimited by peripheral insulating wall 340. In the cross-section view of FIG. 3, only the walls of insulating wall 340 which are parallel to axis X are visible. Insulating wall 340 still comprises, in the present example, a stacked first area 3400 (Bottom Iso) and second area 3402 (Top Iso).

Third area 360 extends along direction X and stops before peripheral insulating wall 340.

According to this embodiment, wall 340 is widened, in a first direction X parallel to collector regions 370, 372, and 374 and to emitter regions 380 and 382 (only collector region 372 can be seen in the cross-section view of FIG. 3), so that base region 390 penetrates into wall 340.

In FIG. 3, base region 390 penetrates into wall 340 over a distance, noted D, in the range from approximately 20% to approximately 50% of the length, noted L, of base region 390 in first direction X, preferably over a distance D in the range from 20% to 50% of length L of the region 390 in first direction X. Base region 390 continues, more preferably, into wall 340 over a distance D of approximately 30% of length L of base region 390 in first direction X, even more preferably over a distance D equal to 30% of length L of region 390 in first direction X.

Alternatively, base region 390 only penetrates into second area 3402 of wall 340. First area 3400 can, where appropriate, have a width smaller than the width of second area 3402, these widths both being evaluated along first direction X.

A device 100 comprising one or a plurality of transistors similar to lateral NPN transistor 500 may be used to protect at least one integrated circuit and/or one discrete electronic component against electrostatic discharges. Device 100 is, for example, capable of protecting input/output circuits against electrostatic discharges which may occur thereacross.

To protect one or a plurality of input/output circuits, each comprising a terminal set to a reference potential (for example, the ground), noted GND, and another terminal taken to a non-zero potential, noted IO, one, for example, couples or connects:

the collector contacts 310, 312 of transistor 500 to the terminal taken to potential IO; and the emitter contact 320 of transistor 500 to the terminal taken to ground GND.

Figure 4:
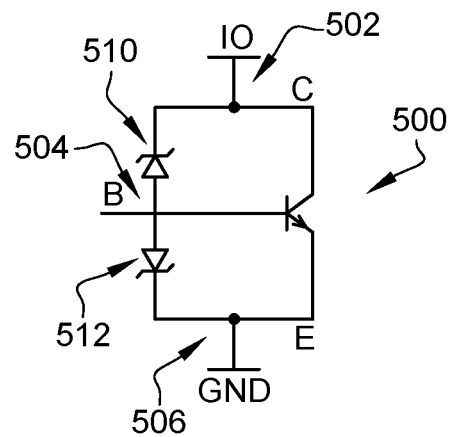
FIG. 4 shows an electrical circuit equivalent to the embodiment of the device discussed in relation with FIGS. 1 to 3.

FIG. 4 shows an electrical circuit equivalent to the embodiment of device 100 discussed in relation with FIGS. 1 to 3.

It is considered hereafter for simplification that device 100 comprises a single lateral NPN transistor 500 as discussed in relation with FIGS. 2 and 3. Transistor 500 of device 100 comprises, in the equivalent electrical circuit of FIG. 4:

a collector terminal 502 (C);

a floating base 504 (B); and an emitter terminal 506 (E).

According to the embodiment discussed in relation with FIGS. 2 and 3:

the collector terminal 502 of transistor 500 is, for example, formed by contacting tracks 310 and 312 connected to the first collector regions 370 and 372;

the floating base 504 of transistor 500 is, for example, formed by base region 390; and the emitter terminal 506 of transistor 500 is, for example, formed by contacting track 320 connected to the second emitter region 380.

The transistor 500 of device 100 also comprises, as illustrated in FIG. 4:

a first Zener diode 510 having its anode connected to the floating base 504 of transistor 500 and having its cathode connected to the collector terminal 502 of transistor 500; and a second Zener diode 512 having its anode connected to floating base 504 of transistor 500 and having its cathode connected to the emitter terminal 506 of transistor 500.

In the example of a device 100 capable of protecting one or a plurality of input/output circuits against electrostatic discharges:

the collector terminal 502 of transistor 500 is connected to an input/output terminal (IO) of the circuit(s) to be protected; and the emitter terminal 506 of transistor 500 is set to ground GND.

Figure 5:
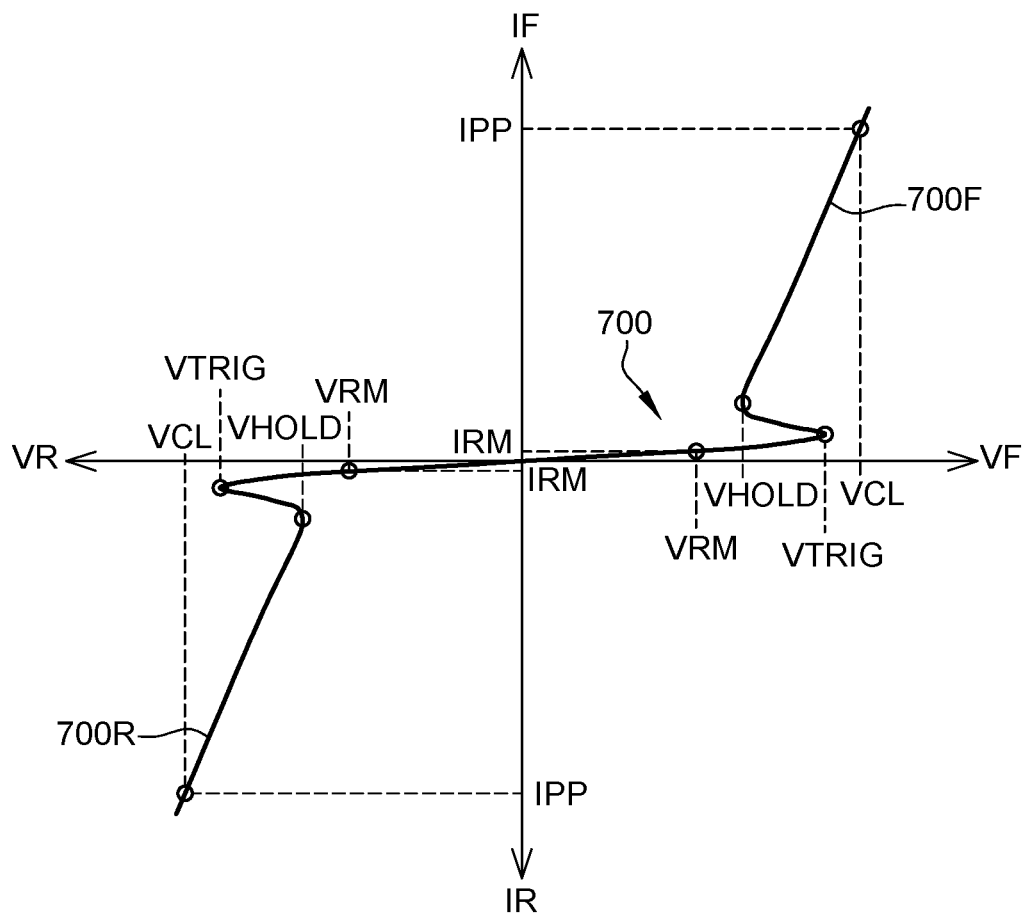
FIG. 5 shows a current-vs.-voltage characteristic of an embodiment of a device of protection against electrostatic discharges.

FIG. 5 shows a current-vs.-voltage characteristic of an embodiment of a device of protection against electrostatic discharges, for example, a device 100 comprising at least one lateral NPN transistor 500. The current-vs.-voltage characteristic of FIG. 5, for example, corresponds to the equivalent circuit discussed in relation with FIG. 4.

A curve 700 reflects, in FIG. 5, an intensity variation of a direct electric current, noted IF, or a reverse current, noted IR, flowing through NPN lateral transistor 500. Such an intensity is a function of a direct bias voltage, noted VF, or of a reverse bias voltage, noted VR.

Curve 700 thus is, in FIG. 5, divided into two portions:

a portion 700F (on the right-hand side, in FIG. 5) corresponding to variations of the direct current IF according to forward bias voltage VF; and a portion 700R (on the left-hand side in FIG. 5) corresponding to variations of reverse current IR according to reverse bias voltage VR.

Portions 700F and 700R of curve 700 are, to within their sign, substantially identical. For simplification, only portion 700F will be described hereafter, the transposition of such a description to portion 700R of curve 700 being within the abilities of those skilled in the art based on the following indications.

In normal operation, the direct bias voltage VF of device 100 may take values in the range from 0 V to a limiting voltage, noted VRM. Limiting voltage VRM corresponds to the maximum voltage value provided for a given application. Limiting voltage VRM is, for example, in the order of 3 V or of 5 V according to the considered application. When transistor 500 is biased under limiting voltage VRM, a leakage current, noted IRM, flows through transistor 500.

In case of an overvoltage due, for example, to an electrostatic discharge, bias voltage VF may temporarily exceed a threshold voltage, noted VTRIG. Threshold voltage VTRIG corresponds to a voltage for triggering the protection. To avoid any risk of untimely triggering of the protection, it is ascertained that threshold voltage VTRIG is greater than the limiting voltage VRM provided in the considered application.

Once threshold voltage VTRIG has been exceeded, that is, once the protection has been triggered, a snap-back effect occurs. Such a snap-back phenomenon causes a significant decrease of the bias voltage across transistor 500. After the snap back, bias voltage VF may thus decrease to a minimum voltage value, called "hold value," noted VHOLD. In other words, hold voltage VHOLD corresponds to the minimum voltage capable of being reached after the triggering of the protection.

The snap-back phenomenon enables transistor 500 to discharge an electric current substantially greater than the current that it would conduct, before the snap-back, under a voltage of same value. In other words, the snapback phenomenon enables transistor 500 to convey a significant current while limiting the voltage increase (the temporary overvoltage) caused by the electrostatic discharge. By thus limiting the voltage increase, risks of deterioration of one or a plurality of circuits and/or components protected by transistor 500 are decreased.

The electrostatic discharge may however be sufficient for the direct bias voltage VF of transistor 500 to keep on increasing even after the triggering of the protection. Such an increase in voltage VF goes along with an increase in the current IF crossing transistor 500. Current IF, which crosses transistor 500, is then substantially proportional to direct bias voltage VF according to a relation of the type IF=VF/RDYN, where RDYN is called "dynamic resistance" of the protection.

As illustrated in FIG. 5, the value of the direct bias voltage VF may then increase up to a value, noted VCL, called clamping voltage. Clamping voltage VCL corresponds to a maximum intensity acceptable by the protection (peak pulse current), noted IPP.

For certain applications, it is desired to obtain a hold voltage VHOLD greater than limiting voltage VRM. The inventors have observed that it is possible to modify the value of hold voltage VHOLD by adjusting the doping level of the base regions and of the emitter regions of transistor 500. In particular, the inventors have observed that an increase in the doping level of the base and emitter regions of transistor 500 causes a decrease in hold voltage VHOLD.

For a transistor 500 having its base region 390 penetrating into peripheral insulating wall 340 (FIG. 3), the inventors have further observed that it is possible to decrease trigger voltage VTRIG without degrading the quality of the protection. This decrease in trigger voltage VTRIG means that the protection is faster and more reactive. The decrease in trigger voltage VTRIG can further reduce the residual clamping voltage VCL seen by the application prior to complete activation of the structure. In other words, the inventors have observed that it is possible to obtain a more sensitive protection by improving the value of its dynamic resistance RDYN, device 100 having an improved series resistance due to the presence of two Zener diodes 510 and 512 (FIG. 4) in parallel.

As discussed in relation with FIG. 3, a base region continuing inside wall 340 over a distance D of approximately 30% of length L of base region 390 in first direction X enables, in particular, to obtain a decrease in clamping voltage VCL by approximately 8.5% for a same current IF. In other words, transistor 500 is capable, under a same voltage VF, to convey a greater current IF than a transistor having a base region 390 which would not penetrate into peripheral insulating wall 340.

A device of protection against electrostatic discharges, comprising at least one device 100 as described above in relation with FIGS. 1 to 3, makes it possible in particular to obtain a hold voltage VHOLD greater than 5 V while maintaining a blocking voltage VCL of less than 7 V. Such a device of protection is thus compatible with applications for which the limit voltage VRM is between about 0 V and about 5 V, preferably between 0 V and 5 V. The value of the desired holding voltage VHOLD is obtained by the presence of the two Zener diodes 510 and 512 (FIG. 4).

Various embodiments and variations have been described. It will be understood by those skilled in the art that certain characteristics of these various embodiments and variations may be combined, and other variations will occur to those skilled in the art. In particular, what has been previously described in relation with FIGS. 1 to 5 takes as an example an embodiment of a device 100 comprising at least one lateral NPN-type transistor 500. However, the conductivity types (the dopings) taken as an example in the present disclosure may be reversed. In particular, the adaptation of such an embodiment to a device 100 comprising at least one lateral PNP-type transistor is within the abilities of those skilled in the art based on the indications provided hereabove.

Finally, the practical implementation of the described embodiments and variations is within the abilities of those skilled in the art based on the functional indications given hereabove. In particular, the connection of the contacting tracks of the transistor(s) 500 comprised in device 100 across the circuit(s) and/or of the discrete components to be protected is within the abilities of those skilled in the art based on the above indications.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device, comprising
a substrate, the substrate including:
   a well;
   a peripheral insulating wall laterally surrounding the well; and at least one lateral bipolar transistor in the well that includes:
a collector region having a first dimension along a first direction;
an emitter region adjacent to the collector region along a second direction that is transverse to the first direction;
a base region that separates the collector and emitter regions from the well, the base region having a second dimension along the first direction that is greater than the first dimension;
a first conductive track on and in contact with the collector region, the first conductive track extending along the first direction, the first conductive track having a first end;
a second conductive track on and in contact with the emitter region, the second conductive track extending along the first direction, the first end of the first conductive track being aligned with an intermediate portion of the second conductive track along the second direction.

2. The device of claim 1, wherein:
the substrate has a first conductivity type;
the peripheral insulating wall has the first conductivity type;
the base region has the first conductivity type;
the well has a second conductivity type different from the first conductivity type; and
the collector and emitter regions have the second conductivity type.

3. The device of claim 2, wherein the first conductivity type is p and the second conductivity type is n.

4. The device of claim 2, wherein the first conductivity type is n and the second conductivity type is p.

5. The device of claim 1, wherein the base region penetrates into the peripheral insulating wall over a distance in the range from approximately 20% to approximately 50% of a length of the base region in the first direction.

6. The device of claim 1, wherein the base region penetrates into the peripheral insulating wall over a distance of approximately 30% of a length of the base region in the first direction.

7. The device of claim 1, further comprising:
first contacting tracks located vertically in line with the collector regions; and
second contacting tracks located vertically in line with the emitter regions.

8. An electrostatic discharge protection device, comprising:
at least one electronic device, including:
a substrate;
a well in the substrate;
a peripheral insulating wall laterally surrounding the well; and
at least one lateral bipolar transistor in the well, the at least one lateral bipolar transistor having:
a collector region;
an emitter region, the collector region and a base region extending along a first direction and spaced laterally apart from one another along a second direction that is transverse to the first direction; and
the base region separating the collector and emitter regions from the well, the well having a first dimension along the first direction, the base region having a second dimension along the first direction, the first dimension being smaller than the second dimension, the collector region having a third dimension in the first direction that is smaller than the second dimension and larger than the first dimension.

9. The device of claim 8, wherein the electrostatic discharge protection device has a holding voltage greater than 5 V and a clamping voltage of less than 7 V.

10. The device of claim 8, configured for protecting an application for which a limit voltage is between about 0 V and about 5 V.

11. The device of claim 8, further comprising:
an input/output (IO) terminal electrically coupled to the collector region of the at least one lateral bipolar transistor,
wherein the emitter region of the at least one lateral bipolar transistor is electrically coupled to an electrical ground.

12. The device of claim 11, further comprising:
a first Zener diode having an anode electrically connected to the base region of the at least one lateral bipolar transistor, the first Zener diode having a cathode electrically connected to the collector region of the at least one lateral bipolar transistor; and
a second Zener diode having another anode electrically connected to the base region of the at least one lateral bipolar transistor, the second Zener diode having another cathode electrically connected to the emitter region of the at least one lateral bipolar transistor.

13. A device, comprising:
a substrate;
a well in the substrate;
a peripheral insulating wall laterally surrounding the well; and
a lateral bipolar transistor in the well, the lateral bipolar transistor having:
a collector region having a longest dimension extending in a first direction;
an emitter region spaced from the collector region in a second direction that is transverse to the first direction; and
a base region, the collector region and the emitter region being spaced from the insulating wall by the base region, the collector region and the emitter region being spaced, from the well by the base region;
a first electrode that extends along the first direction and is in contact with the collector region; and
a second electrode that extends along the first direction and is in contact with the emitter region.

14. The device of claim 13, wherein:
the substrate has a first conductivity type;
the peripheral insulating wall has the first conductivity type;
the base region has the first conductivity type;
the well has a second conductivity type different from the first conductivity type; and
the collector and emitter regions have the second conductivity type.

15. The device of claim 13, wherein the base region penetrates into the peripheral insulating wall over a distance in the range from approximately 20% to approximately 50% of a length of the base region in the first direction.

16. The device of claim 13, wherein the base region penetrates into the peripheral insulating wall over a distance of approximately 30% of a length of the base region in the first direction.

* * * * *